United States Patent

Wang et al.

[11] Patent Number: 5,859,787
[45] Date of Patent: Jan. 12, 1999

[54] ARBITRARY-RATIO SAMPLING RATE CONVERTER USING APPROXIMATION BY SEGMENTED POLYNOMIAL FUNCTIONS

[75] Inventors: Avery L. Wang, Redwood City, Calif.; Brooks S. Read, Grafton, Mass.

[73] Assignee: Chromatic Research, Inc., Mountain View, Calif.

[21] Appl. No.: 555,538

[22] Filed: Nov. 9, 1995

[51] Int. Cl.$^6$ .................................................. G06F 17/10
[52] U.S. Cl. .................... 364/724.12; 364/718; 364/721; 341/61
[58] Field of Search .................................. 364/718, 721, 364/724.1; 341/61

[56] References Cited

U.S. PATENT DOCUMENTS

| | | | |
|---|---|---|---|
| 4,774,685 | 9/1988 | Samuels | 364/718 |
| 5,068,816 | 11/1991 | Noetzel | 364/718 |
| 5,184,317 | 2/1993 | Pickett | 364/735 |
| 5,226,000 | 7/1993 | Moses et al. | 364/724.1 |
| 5,285,394 | 2/1994 | Montalcini et al. | 364/474.31 |
| 5,389,923 | 2/1995 | Iwata et al. | 341/61 |
| 5,471,411 | 11/1995 | Adams et al. | 364/724.01 |
| 5,489,903 | 2/1996 | Wilson et al. | 341/144 |
| 5,519,647 | 5/1996 | DeVille | 364/721 |
| 5,627,861 | 5/1997 | Kataoka | 375/324 |

*Primary Examiner*—Reba I. Elmore
*Assistant Examiner*—Sheela S. Rao
*Attorney, Agent, or Firm*—Skjerven, Morrill, MacPherson, Franklin & Friel LLP; Edward C. Kwok; Hugh H. Matsubayashi

[57] ABSTRACT

A method for resampling includes convolving a given set of samples with the impulse response function of a low-pass filter. In this method, values of the impulse response required for the convolution calculation are computed at the time of resampling from a segmented polynomial approximating the impulse response.

10 Claims, 6 Drawing Sheets

ARBITRARY-RATIO SAMPLING RATE CONVERTER USING APPROXIMATION BY SEGMENTED POLYNOMIAL FUNCTIONS

BACKGROUND OF THE INVENTION

1. Field of the Invention

The present invention relates to digital signal processing. In particular, the present invention relates to arbitrary-ratio signal resampling techniques in digital signal processing.

2. Discussion of the Related Art

Arbitrary-ratio signal resampling refers to the process which computes sample values of a signal, as if it is sampled at a given rate, using values of that signal sampled originally at a different rate. The original signal is assumed to be bandlimited to one half of the original sampling rate, thereby permitting, as per the well-known Nyquist sampling theorem, unique recovery (i.e. the avoidance of aliasing) of the signal for all time from the original samples.

Arbitrary-ratio signal resampling techniques can be applied, for example, in an audio processing system, in which an input stream is received at a constant sampling rate, and an output stream is required to be generated in real time at a different constant sampling rate. In one application, a pre-recorded digital audio stream originally sampled at a given sampling rate is played back at a different sampling rate dictated by the play-back system. In another application, to mix an audio signal stored in one medium (e.g. digital audio tapes which can be sampled at 32, 44.1 or 48 KHz) with an audio signal from a different source (e.g. a compact disk, which is sampled at 44.1 KHz), arbitrary-ratio resampling techniques must be applied.

Arbitrary-ratio signal resampling techniques can also be applied to create a constant rate output stream from a sound recording being played back at a specific different sampling rate to create such special effects as Doppler shifting and pitch shifting. Pitch shifting is a technique used in sampling wave table music synthesis. Doppler shifting is a technique used in creating such sound effects as a moving sound source.

Further, arbitrary-ratio resampling techniques can also be applied to create a constant sampling rate output stream from a source which sampling rate is either not precisely known in advance, or which may drift. In such application, the sampling ratio must be adjusted in real-time to keep the input and output streams synchronized. This synchronization is called asynchronous resampling, and is used where digital audio sources are produced using independent clocks, as often arises in digital audio mixing consoles and digital stereos. Manufacturing process variations, temperature differences, and power supply variations can all cause identical clock generation circuits to oscillate at slightly different frequencies. In some situations, it may not be feasible to use a single master clock to be a time base for an entire digital audio network, such as when one digital source is a transmitting satellite, and the receiver receiving the signal is on the ground.

One view of the resampling process is provided by the so-called "analog interpretation" as discussed in the text of Crochiere and Rabiner (*Multirate Digital Signal Processing*, Prentice-Hall Inc., Englewood Cliffs, N.J., 1983). This view is depicted in FIG. 1.

Referring to FIG. 1, an analog signal x(t), assumed bandlimited to a frequency range of $0.5/T_s$, is sampled at intervals of $T_s$ to result in a discrete time series x[n], where x[n] is the sampled value of x(t) at $t=nT_s$, for integer values of n. The discrete time series can be represented by continuous-time signal 1, which can be expressed as:

$$\tilde{x}(t) = \sum_{-\infty}^{\infty} x[n]\delta(t - nT_s) \quad (1)$$

As shown in FIG. 1, signal $\tilde{x}(t)$ passes through an analog low-pass filter 2, which is defined by an impulse response function h(t). The output signal of filter 2 is a signal 3, $\hat{x}(t)$ which is equal to the convolution of h(t) and $\tilde{x}(t)$, expressed as $$\hat{x}(t) = \int_{-\infty}^{\infty} \tilde{x}(\tau)h(t-\tau)d\tau = \sum_{n=-\infty}^{\infty} x[n]h(t - nT_s) \quad (2)$$

In theory, filter 2 can be provided by an ideal low-pass filter with a cutoff frequency of $0.5/T_s$, i.e. a filter having an impulse function response of $$h(t) = sinc\left(\frac{\pi t}{T_s}\right) = \frac{\sin\left(\frac{\pi t}{T_s}\right)}{\frac{\pi t}{T_s}} \quad (3)$$

The ideal low-pass filter has a perfect "brick wall" frequency response and would provide for ideal signal reconstruction. However, in a practical implementation in which only finite number of terms can be computed, $\hat{x}(t)$ is typically approximated using a windowed sinc function. Such a windowed since function can be provided by a Hanning or a Kaiser window, for example. An example of an impulse response function, h(t), that is non-zero over a finite range is illustrated by FIG. 3. In FIG. 3, h(t) is zero outside of the range of [-3,3] (in units of $T_s$)

Resampling is achieved by sampling signal $\hat{x}(t)$ according to the resampling ratio r=M/N (M and N being relatively prime integers), which is the ratio of the original sampling rate to the new sampling rate. Referring back to FIG. 1, signal $\hat{x}(t)$ is shown to be provided to a sampling circuit ("sampler") 4, together with the ratio r (indicated in FIG. 1 by reference numeral 5) to provide an output resampled signal $\bar{x}(t)$, indicated in FIG. 1 by signal 6, given by:

$$\bar{x}(t) = \sum_{m=-\infty}^{\infty} \sum_{n=-\infty}^{\infty} x[n]h(mrT_s - nT_s)\delta(t - mrT_s)$$

If the ratio r is less than 1, aliasing will not occur. In this case h(t) may be chosen to be a windowed sinc function with a scaling factor of $1/T_s$, i.e.

$$h(t) = w(t) = \frac{\sin\left(\frac{\pi t}{T_s}\right)}{\frac{\pi t}{T_s}} \quad (4)$$

where w(t) is the windowing function used. To resample the signal x[n] at the new sampling rate it suffices to store values of h(t) at times $t=T_0, T_0+T_s/N, T_0+2T_s/N, \ldots, T_0+T$ where $[T_0, T_0+T]$ is the interval outside of which h(t) is zero. Hence, to achieve this resampling, $NT/T_s$ filter coefficients (i.e. values of the filter's impulse response) must be stored.

For example, if M/N=3/4 and h(t) is the impulse response function of FIG. 3, then values for h(t) would need to be stored for all the original sampling times in the non-zero finite range for h(t) (shown in FIG. 3 as points on the time line marked by a dot) and for the three equally spaced points between these original sampling times (marked in FIG. 3 by an "x" on the time line).

Thus, given a resampling ratio r less than 1, the total number of filter coefficients required to be stored is $NT/T_s$, where T is the duration ("support") of the finite time range for which h(t) is non-zero (e.g. $NT/T_s=24$ for the impulse response of FIG. 3). Clearly, the total number of filter coefficients can become impractically large for a large N.

On the other hand, if the resampling ratio is greater than 1, aliasing can be avoided by applying a low pass filter with an impulse response of h'(t)=bh(bt), where h(t) is as defined above and $b \leq N/M$. The resulting bandwidth of h'(t) is proportional to b.

Noting that for the minimally attenuated case, b=N/M, the support of h' (t) is T'=T/b=MT/N time units long. In this case, the number of sampling points of h' (t) that need to be stored is $N \cdot T'/T_s = MT/T_s$, so that the number of stored filter coefficients is proportional to M. In general, the number of samples of h(t) needed is $T/T_s \max(N,M)$. Clearly, the total number of coefficients can become impractically large for large M or N.

Storing these filter coefficients for resampling under a given a resampling ratio is the approach taken by "polyphase" filters. Each group of stored filter coefficients corresponds to one phase filter of a "polyphase" filter. Typically, only one phase is required to provide a resampled output sample at a particular resampling time.

For example, given the impulse response, h(t), of FIG. 3, one required phase filter for resampling at a rate 4/3 the rate of the original sampling would consist of values for h(−9/4), h(−5/4), h(−1/4), h(3/4), h(7/4) and h(11/4), i.e. values for h(t) at time instants 31 of FIG. 3. Application of equation (2) reveals that only this phase filter is required for the calculation of $\hat{x}(3T_s/4)$ i.e. a sample at the resampling time of $t=3T_s/4$. On the other hand, the determination of $\hat{x}(3T_s/2)$ i.e. a sample at the resampling time of $t=3T_s/2$, according to equation (2), requires another phase filter, namely the one consisting of values for h(−5/2), h(−3/2), h(−1/2), h(1/2), h(3/2) and h(5/2), i.e. values for h(t) at time instants 32 of FIG. 3.

Polyphase filters are described at length in Vaidyanathan (*Multirate Systems and filter banks*, Englewood Cliffs, N.J.: Prentice-Hall 1993) and in Rabiner and Crochiere, which is referenced above. Depending on the resampling ratio, the basic polyphase filter technique can lead to an impractically large number of stored filter coefficients. Another important shortcoming of the polyphase filter approach arises from the requirement that the resampling ratios implemented in the filter must be ratios of integers. Consequently, the polyphase filter cannot accommodate situations where the resampling ratio varies over time.

An article ("Smith") by Smith and Gossett, entitled "A flexible sampling-rate conversion method", *Proc. ICASSP*, pp. 19.4.1–19.4.4, 1984, describes a technique that permits resampling at arbitrary times. As in the polyphase filter technique described above, Smith stores in a table samples of the impulse response of a low-pass filter. However, Smith permits values of the impulse response function to be determined at arbitrary times (and hence resampling at arbitrary times) by interpolating between values stored in the table. Smith shows that the number of stored values of the impulse response per original sampling time is approximately:

$$L = \sqrt{2^{n_c}}, \quad (5)$$

where $n_c$ is the number of significant bits desired for each stored value. Even then, Smith's approach still results in a storing a large number of samples of the impulse response.

An article ("Adams") by Adams and Kwan, entitled "Theory and VLSI architectures for asynchronous sample—rate converters", *J. Audio Engineering Society*, vol. 41, July/August 1993, p. 550, describes a similar strategy in a VLSI implementation. In particular, using linear interpolation and storing only every 128th point of a filter that is oversampled by a factor of $2^{16}$ (i.e. having $2^{16}$ coefficients per original sampling period), Adams was able to reduce the filter coefficient ROM table size from 40 megawords to 32K words.

Recently, an article ("Zölzer") by Zölzer and Boltze, entitled "Interpolation algorithms: Theory and application", *97th Audio Engineering Society Convention, Preprint No. 3398*, Nov. 1994, describes calculating filter coefficients for resampling in real-time. Zölzer discusses resampling techniques based on polynomial, Lagrange, and spline interpolations. Each of the approaches described in Zölzer involves first calculating an oversampled input sequence, using a standard polyphase filter technique. This first step is then followed by interpolation (either polynomial, Lagrange or spline) among samples of the oversampled input sequence to determine resampling outputs at the desired times.

Zölzer's approach results, for an $N^{th}$ order interpolation, in a frequency response which is approximated by the function $\text{sinc}^{N+1}$ (t) (except in the spline case, where it is exact), instead of the sinc frequency response associated with ideal bandlimited interpolation. To compensate for the non-ideal frequency response, Zölzer's resampled output sequence is filtered by a compensation filter using calculated coefficients. However, some distortion in the frequency domain remains (Zölzer's FIG. 13).

SUMMARY OF THE INVENTION

The present invention provides a method for resampling, which convolves a given set of samples with the impulse response function of a low-pass filter. Under this method, values of the impulse response required for the convolution calculation are computed at the time of resampling from a segmented polynomial approximating the impulse response. The present invention is economical because processors capable of computing the impulse response function in real time are becoming more available and less expensive.

The segmented polynomial of the present invention is represented, for each segment of the polynomial, by a number of coefficients. These coefficients are determined by fitting, in a least mean-squared sense, the polynomial to the impulse response function at a large number of points. The cost of computing the polynomial coefficients is not incurred at resampling time, and need only be carried out once and stored in a memory device.

In one application of the present invention, an electronic musical instrument performs resampling of a musical tone at a selected set of time points based on discrete samples of a stored waveform. This resampling technique allows a stored waveform to be used for synthesizing many tones of varying pitches. The samples at the selected set of time points can then be provided at a constant rate to an output device to produce a second musical tone having a pitch proportional to the inverse of the resampling ratio.

DETAILED DESCRIPTION OF THE PREFERRED EMBODIMENTS

Figure 1:
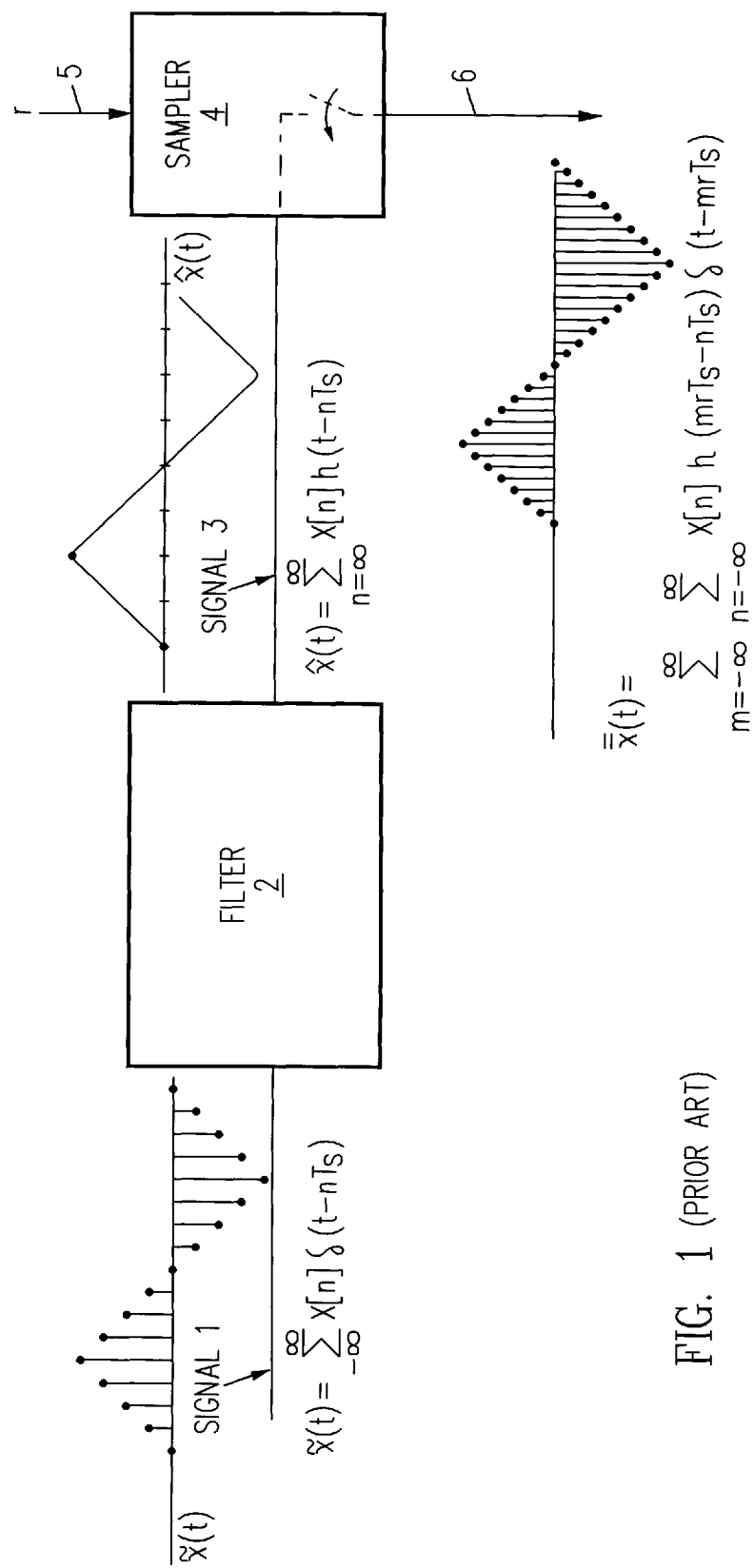
FIG. 1 (prior art) shows a model of an analog interpretation of the resampling process.

The present invention provides arbitrary-ratio resampling of an analog signal x(t), which is originally sampled at time intervals of $T_s$ to produce samples x[n], for non-negative integer n, where x[n] denotes the sample at time $nT_s$ and the original sampling interval, $T_s$, satisfies the Nyquist condition. The goal of arbitrary-ratio resampling is to provide samples of x(t) at arbitrary values of t, given the original samples x[n].

One view of the reconstruction of x(t) from the given samples is the application of an input analog signal, taking on the values of the original sample at the original sampling times and zero elsewhere, to a low-pass filter whose cutoff frequency is $0.5/T_s$ and whose impulse response function is h(t). A reconstructed sample value, $\hat{x}(t)$, is computed as the value of the output of the analog filter at time t (as per equation (2), above), i.e.

$$\hat{x}(t) = \sum_{n=-\infty}^{\infty} x[n]h(t - nT_s) \qquad (6)$$

h(t) is chosen to be zero except in a finite interval [0,T], in order to reduce the above sum to one having a finite number of terms. Typically, a windowed sinc function is used for h(t).

The resampling technique of the present invention involves the following two steps:

1) the step of calculating coefficients of a segmented polynomial that approximates h(t) in the interval [0,T]. (In some embodiments, the segmented polynomial may consist of only one segment, in which case one polynomial function is used to approximate h(t) over the entire interval of [0,T].) This step need only be performed once in advance of the resampling. The coefficients of the segmented polynomial thus calculated are stored in a memory device which is made accessible to the second step below.

2) the step of computing, for each resampling time point, the convolution sum according to equation 2 above. In this embodiment, the required values of h(t) are computed by evaluating, at the required resampling time points, the segmented polynomial, whose coefficients were calculated and stored according to the first step above.

The segmented polynomial of the present invention is obtained by mapping the interval [0,T), to the interval [0, $N_s$), where $N_s$ is a positive integer. Hence, any time point t in [0, T) will be mapped to a real number s, defined by:

$$s = tN_s/T = m + f \qquad (7)$$

where m is an integer between 0 and $N_s$−1, inclusive, and f is the fractional part in the interval [0,1). The impulse response function h(t) at interval [m, m+1] is approximated by a segmented polynomial $P_m(f)$, where $P_m$ is the polynomial corresponding to the mth segment. The set of polynomials $P_0, P_1, \ldots P_{N_s-1}$, is referred to as a segmented polynomial.

Although not essential for the practice of the present invention, in the technique disclosed below, the fractional part f of real value s is normalized to be a value f', which is a new value between −1 and +1, via the equation $$f' = 2f - 1 \qquad (8)$$

Remapping the polynomial argument of the polynomial range from [−1, 1) instead of [0, 1) results in better dynamic range, given fixed-point, finite-precision coefficients, yielding about a 6–10 dB improvement in accuracy.

Each polynomial $P_m$ is represented by a set $\{c_m(i)\}$ of coefficients, where coefficient $c_m(i)$ is the coefficient of the i-th order term in the polynomial $P_m$. The polynomial $P_m$ therefore takes the form $$P_m(f') = \sum_{i=0}^{D} c_m(i)(f')^i$$

where the argument f' of $P_m$ is normalized over the interval [−1,1), and D is the empirically selected degree of polynomial $P_m$. D is selected such that $P_m$ approximates the corresponding segment of h(t) to the requisite precision.

A large number N (>>D) of values f' ($f'_1, f'_2, \ldots f'_N$) are selected from the interval [−1, 1) to fit $P_m(f')$ to impulse response function h(t). (In one embodiment, ($f'_1, f'_2, \ldots f'_N$) can be chosen to be uniformly spread over the interval [−1, 1). In other embodiments, more samples may be taken in particular subranges of the interval [−1,1) in order to reduce the error in those subranges.)

Applying equations (7) and (8) above, the value of t (i.e. the argument of the impulse response function h) is related to $f'_i$ by $$t = \frac{T}{N_s}\left(m + \frac{f'_i + 1}{2}\right).$$

Thus, the following matrix equation is satisfied if $P_m(f')$ exactly fits h(t) at all N values of f':

$$MC_m = V_m, \qquad (9)$$

where, $C_m$ is a vector formed by polynomial coefficients $\{c_m(i)\}$:

$$C_m = \begin{bmatrix} c_m(0) \\ c_m(1) \\ \vdots \\ c_m(D) \end{bmatrix}, \qquad (10)$$

matrix M is:

$$M = \begin{bmatrix} 1 & f'_1 & (f'_1)^2 & \ldots & (f'_1)^D \\ 1 & f'_2 & (f'_2)^2 & \ldots & (f'_2)^D \\ & & \vdots & & \\ 1 & f'_N & (f'_N)^2 & \ldots & (f'_N)^D \end{bmatrix}, \qquad (11)$$

and vector V is:

$$V_m = \begin{bmatrix} v_m(f_1) \\ v_m(f_2) \\ \cdot \\ \cdot \\ \cdot \\ v_m(f_N) \end{bmatrix} \quad (12)$$

which is related to the impulse response function h(t) by:

$$v_m(f) = h\left(\frac{T}{N_s}\left(m + \frac{f+1}{2}\right)\right). \quad (13)$$

Since N is selected to be much larger D, equation 9 is overdetermined. Thus, in general, an exact solution does not exist. However, a least mean-squared error solution can be found by finding the pseudo-inverse matrix $M^\dagger$ of M defined by:

$$M^\dagger = (M^T M)^{-1} M^T. \quad (14)$$

The coefficients $C_m$ of $P_m$, that minimize the mean squared difference (i.e. mean squared error) between $P_m(f)$ and h(t) at $f=(f_1, f_2, \ldots f_N)$, where $$t = \left(\frac{T}{N_s}\left(m + \frac{f+1}{2}\right)\right),$$

are given by the equation:

$$C_m = M^\dagger V_m \quad (15)$$

Alternatively, the coefficients $C_m$, that minimize the mean-squared difference between $P_m(f)$ and h(t) at the fitting points, can also be found by performing Gaussian elimination or LU decomposition followed by back substitution on the system of equations given by:

$$M^T M C_m = M^T V_m \quad (16)$$

These solution methods are well-known, and can be found, for example, in the text "Numerical Recipes in C" (2nd ed., Press, Teukolsky, Vetterling & Flannery, Cambridge University Press, 1992).

One advantage of using equation (16) instead of equation (15) to solve for the coefficients $C_m$ is a reduction in the amount of memory required for intermediate results. In order to compute the pseudo-inverse of matrix M, i.e. $M^\dagger$, which is required in equation (15), matrix M, which has N*(D+1) elements, must be stored. On the other hand, matrix M need not be stored if the coefficients $C_m$ of $P_m(f)$ are obtained by solving the system of equation (16). This is because the quantities $M^T M$ and $M^T V_m$ can be computed directly via the following equations (17) & (18) respectively:

$$M^T M = \sum_{k=1}^{N} \begin{bmatrix} 1 \\ f_k \\ (f_k)^2 \\ \cdot \\ \cdot \\ (f_k)^D \end{bmatrix} [1 \, f_k \, (f_k)^2 \ldots (f_k)^D] \quad (17)$$

and $$M^T V_m = \sum_{k=1}^{N} \begin{bmatrix} 1 \\ f_k \\ (f_k)^2 \\ \cdot \\ \cdot \\ (f_k)^D \end{bmatrix} v_m(f_k) \quad (18)$$

$M^T M$ and $M^T V_m$ have dimensions of (D+1)×(D+1) and (D+1)×1, respectively, and thus, require far less storage than M, given that N is selected to be much greater than D.

The number of points, N, which is used to solve for coefficients $\{C_m(i)\}$ can be as large as desired, without concern for efficiency, given that the coefficient calculation, represented by equations (14) and (15) (or alternatively by equation (16)), need only be performed once. Further, coefficients $\{C_m(i)\}$ can be computed off-line, so as not to have an impact on the resampling operations. The mean-squared error (MSE) for the n-th segment is then provided by the equation:

$$\epsilon_m^2 = \|MC_m - V_m\|_2^2 \quad (19)$$

$$= \frac{1}{N}[V_m^T V_m - V_m^T M(M^T M)^{-1} M^T V_m]. \quad (20)$$

To minimize the MSE to the requisite level of accuracy, either the order D of polynomial $P_m$, or the number of segments $N_s$, or both, may be increased, as necessary.

In some embodiments, other metrics may be used also for finding $C_m$. For example, the error value $$\epsilon_m = \|MC_m - V_m\| \quad (21)$$

may be minimized by using an $L_\infty$-norm instead of the $L_2$-norm used above. This minimizes the absolute error instead of the mean-squared error. The preferred metric for minimization is the mean-square error ($L_2$) since it reduces the total error energy.

Using the mapping above, a value of h(t) required during resampling is approximated as, $P_m(f)$, where t is mapped to m and f by application of equations (7) and (8). A convenient way of mapping t to m and f is provided by the following steps:

1) compute the quantity $s = m + f = t * N_s/T$ and store s in unsigned fixed point format with x bits (to the left of the floating point) used to represent m (the integer part of s) and y bits (to the right of the floating point) used to represent f (the fractional part of s) in two registers 1 and 2, respectively;

2) shift register 1 to the right by y bits to obtain m in integer format;

3) shift register 2 to the left by x bits to obtain f in unsigned fixed point representation;

4) invert the most significant bit (MSB) of register 2 to obtain f in signed fixed-point representation in two's complement (where the sign bit is the MSB in register 2 and the fixed point is to the immediate right of the MSB).

Figure 4:
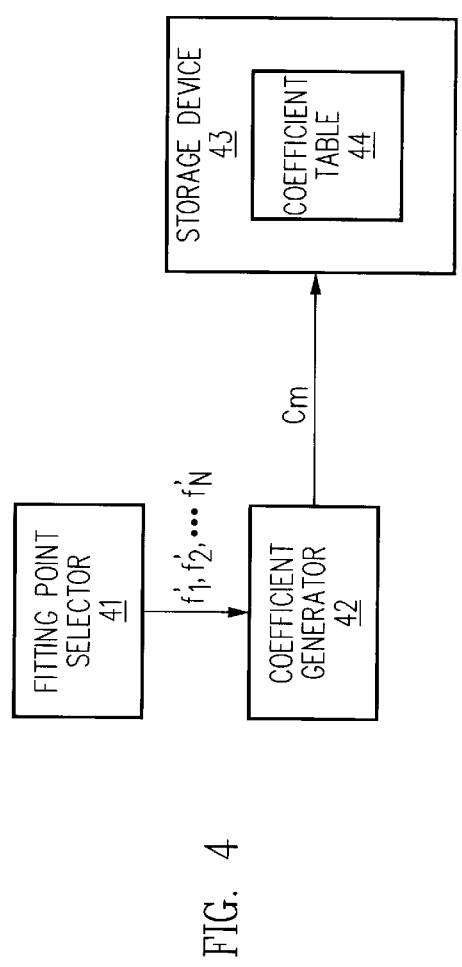
FIG. 4 shows an apparatus for generating coefficients of a polynomial function that approximates an impulse response function of a low-pass filter.

FIG. 4 shows the overall process for generating coefficients ($c_{mm}(0), c_{mm}(1), \ldots c_m(D)$) for a polynomial $$P_m(f) = \sum_{i=0}^{D} c_m(i)(f)^i$$

to approximate an impulse response function h(t), over the m-th segment of a non-zero range of h(t). A curve fitting step 41 selects points ($f'_1, f'_2, \ldots f'_N$) in the range $f'$ of the polynomial $P_m(f')$. The corresponding points $f'_1, f'_2, \ldots f'_N$ in the time domain of $h(t)$ are $t_1, t_2, \ldots t_N$, respectively. A coefficient generating step 42 computes the coefficients of the polynomial ($c_m(0), c_m(1), \ldots c_m(D)$) that fits, according to some error-minimizing criterion, the values of the polynomial evaluated at points $f'_1, f'_2, \ldots f'_N$, respectively, to the values of the impulse response function $h(t)$ at the times $t_1, t_2, \ldots t_N$. The computed coefficients, $C_m$, are stored in a coefficient table 44 in a storage device 43. Coefficient generating step 42 computes and stores in coefficient table 44 the coefficients of each segment of the segmented polynomial approximating $h(t)$ (i.e. $C_m$, $0 \leq m < N_S$). Of course, coefficient generating step 42 can be implemented either in software or in hardware.

Figure 6:
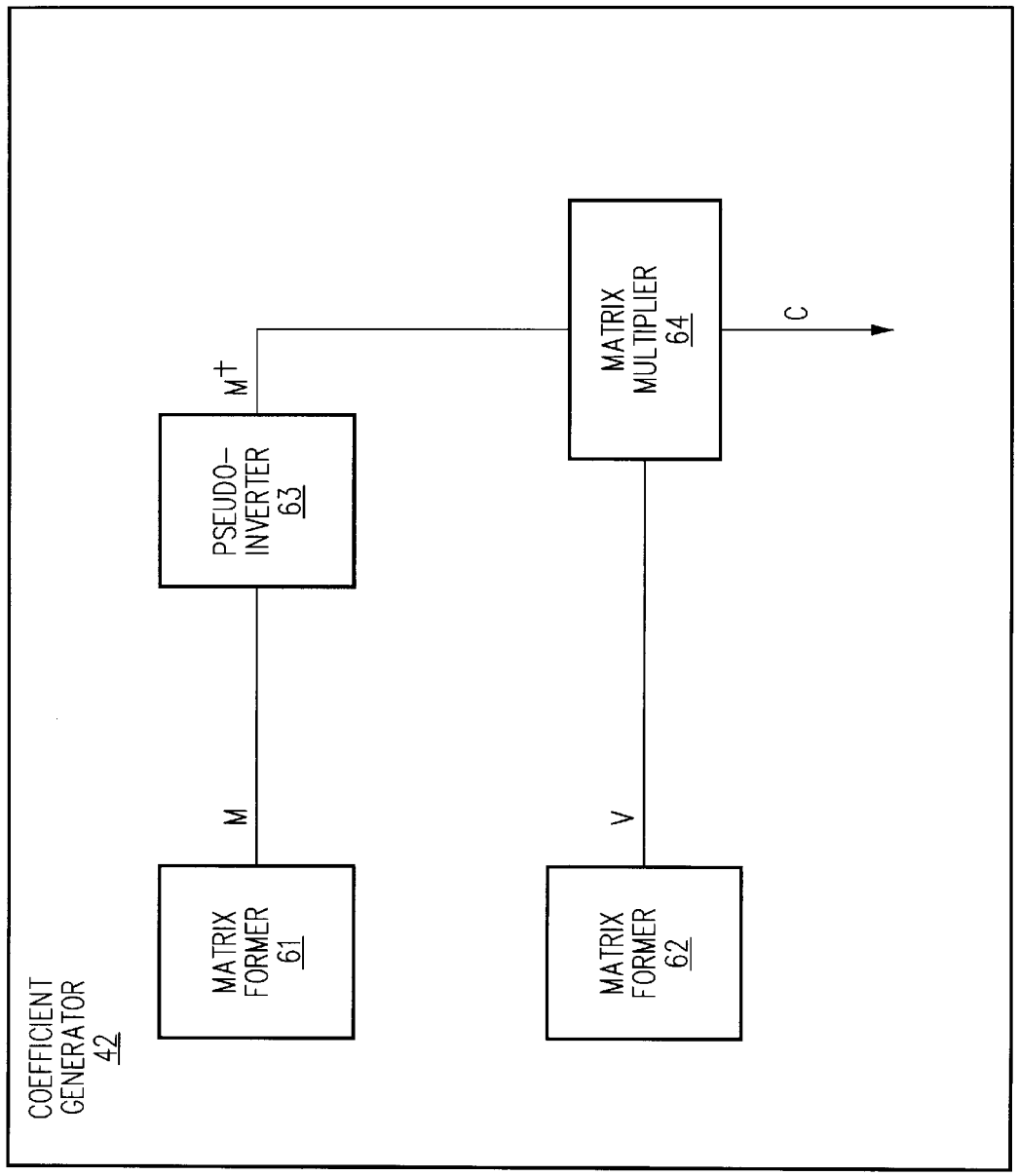
FIG. 6 shows in further detail the coefficient generator provided in the apparatus of FIG. 4.

In one embodiment, the fitting criterion used by coefficient generating step 42 is least mean-squared error, as discussed above. For this embodiment, a structure for implementing coefficient generating step 42 (FIG. 4) is illustrated in FIG. 6. Coefficient generating step 42 includes a matrix construction step 61, a matrix construction step 62, a pseudo-inverting step 63 and a matrix multiplication step 64. Matrix construction step 61 forms the matrix M, according to equation (11) above. Pseudo-inverting step 63 receives matrix M after matrix construction step 61 and produces the pseudo-inverse of M (i.e. $M^\dagger$), according to equation (14) presented above.

Matrix construction step 62 forms the N×1 matrix V, where $V[i]=h(t_i)$, $1 \leq i \leq N$. Matrix multiplication step 64 receives matrices $M^\dagger$ and V from pseudo-inverting step 63 and matrix construction step 62, respectively, and produces the product $C_m = M^\dagger V$, where $C_m$ is a (D+1)×1 matrix and $C_m[i]=c_m(i)$, $0 \leq i \leq D$.

Figure 5:
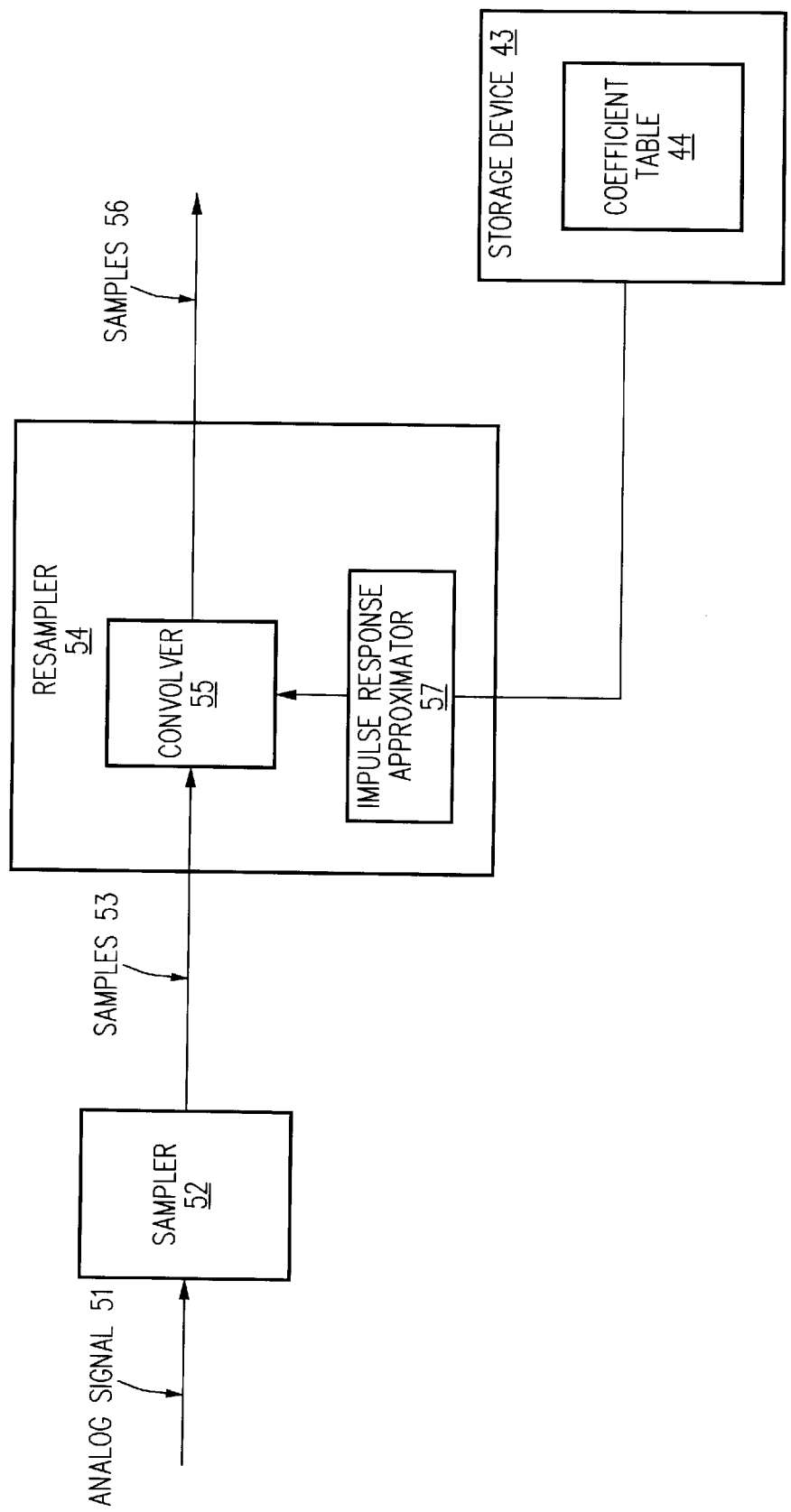
FIG. 5 illustrates an apparatus for resampling an analog signal using a polynomial function that approximates an impulse response function of a low-pass filter.

The resampling step is discussed with reference to FIG. 5. A sampling step 52 samples an analog signal 51 at an original set of sampling time points to produce a set of samples 53. A resampling step 54 includes a convolving step 55 which convolves, according to equation 2, samples 53 with values of the impulse response function approximated by an impulse response approximation step 57 to produce a set of samples 56 for the resampling time points. Impulse response approximation step 57 approximates the impulse response by evaluating the coefficients of the segmented polynomial, which are stored in coefficient table 44 of storage device 43. Again, resampling step 54 can be implemented either in software or in hardware.

Given a target sampling period of $rT_s$ (i.e. a resampling ratio of r), the k-th output sample occurs at time (in units of $T_s$)

$$t_{out,k} = krT_s \qquad (22)$$

Because the "brightness" of a filter depends on the duration of its non-zero impulse response, a common way of controlling this brightness is to scale the time axis of the filter, using a brightness factor b:

$$h'(t) = h(bt). \qquad (23)$$

However, this modification of $h(t)$ results in a scaling of the DC response of the filter, since the DC gain is inversely proportional to b. Therefore, if constant "loudness" is desired, the filter may be modified to preserve power by scaling:

$$h'(t) = bh(bt), \qquad (24)$$

thereby preserving as constant the DC response. Thus, we see that larger values of the brightness factor lead to narrower impulse responses, hence widening the frequency response.

When r>1 (i.e. when the new sampling rate is less than the original sampling rate), in order to avoid aliasing, the impulse response function, $h(t)$, used for resampling must correspond to a low-pass filter whose cutoff frequency is chosen to be less than half the resampling rate, and having a brightness factor b no greater than 1/r.

Applying equation (2) to a low-pass filter with impulse response of $h'(t)=bh(bt)$, the following expression for $\hat{x}(t)$ is obtained given that $h(t)$ is zero outside the interval $[0,T]$ and assuming $x[n]=0$ for $n<0$ and $h(t)$ is symmetric (i.e. $h(t)=h(T-t)$), as typically of windowed sinc functions:

$$\hat{x}(t) = \int_0^\infty \tilde{x}(\tau) h'(t-\tau) d\tau \qquad (25)$$

(change in variables: $\tau \to \tau + t$)

$$= \int_0^\infty \tilde{x}(t+\tau) h'(-\tau) d\tau \qquad (26)$$

(applying $h'(t) = bh(bt)$ and $h(t) = h(T-t)$)

$$= b \int_0^\infty \tilde{x}(t+\tau) h(T+b\tau) d\tau \qquad (27)$$

(substitute $\tau$ with $\tau - T/b$)

$$= b \int_0^\infty \tilde{x}(t - T/b + \tau) h(b\tau) d\tau \qquad (28)$$

(given that $h = 0$ outside $[0, T]$)

$$= b \int_0^{T/b} \tilde{x}(t - T/b + \tau) h(b\tau) d\tau \qquad (29)$$

If $\tilde{x}(t)$ is time-shifted forward by T/b time units, the right hand side of equation (29) becomes $$= b \int_0^{T/b} \tilde{x}(t+\tau) h(b\tau) d\tau \qquad (30)$$

(This form is equivalent to the convolution of $\tilde{x}(t)$ and $g(t)=h(-t)$, and is adopted for convenience.)

$$= b \sum_{k=1}^{\lfloor T/(T_s b) + frac(t) \rfloor} x[\lfloor t/T_s \rfloor + k] h(bT_s(k - frac(t))) \qquad (31)$$

$\hat{x}(t)$ must be sampled in the discrete time domain at the new sampling rate $1/(rT_s)$. Using equation 20 above, the nth resampled value $y[n]$ is given by:

$$y = \hat{x}(t_{out,n}) = \hat{x}(t = nrT_s) \qquad (32)$$

$$= b \sum_{k=1}^{\lfloor T/(T_s b) + frac(nrT_s) \rfloor} xh(bT_s(k - frac(nrT_s))) \qquad (33)$$

$h(bT_s(k-frac(nrT_s)))$ is approximated by $P_m(f')$ where equations (7) and (8) are applied to map $t=bT_s(k-frac(nrT_s))$ to m and f', and the coefficients for $P_m$ were calculated and stored in the manner provided above.

In one embodiment $P_m(f')$ can be calculated on a signal processor VSP, available from Chromatic Research, Inc., Mountain View, Calif., which includes two functional units, FU1 and FU2, capable of generating in one cycle partial results from (i) the multiplication of two double word operands a & b, and (ii) adding the partial results to another double word operand c. Thus, even though the latency in calculating the quantity ab+c requires two cycles, using pipelining, an effective throughput rate of one such calculation (i.e. multiplication followed by an addition, hereinafter "multiply-add" operation) can be achieved per cycle.

Assuming D (the degree of the segmented polynomial) equals 4, polynomial $P_m(f')$ can be expressed as follows:

$$P_m(f')=((((c_m(4)f')+c_m(3))f'+c_m(2))f'+c_m(1))f'+c_m(0)$$

Thus, the calculation of this polynomial $P_m(f')$ requires four multiply-add operations. If the value of f' or each polynomial coefficient is packed in a half-word and since FU1 and FU2 are capable of performing four parallel operations on corresponding halfwords of double word operands, an effective rate of one computation of an approximated impulse response value per cycle can be achieved.

In one embodiment, the convolution of equation 33 to obtain a first resampled value is computed on a processor having three functional units FU1, FU2, and FU3:

1) FU1 computes the four products of corresponding halfwords of two double word operands A (storing 4 half-word approximated values of h) and B (storing 4 half-word original sample values, x).

2) FU2 is used to accumulate the products produced in (1) in the corresponding halfwords of a double word accumulator.

The combination of (1) and (2) (hereinafter a "multiply-accumulate" operation) requires two cycles. However, through pipelining, an effective rate of one multiply-accumulate operation per cycle can be achieved. Each multiply-accumulate operation results in the accumulation of four of the product terms in the convolution of equation 33. Assuming for the purposes of this example that this convolution operation involves twenty four terms, six multiply-accumulate operations are performed, after which each halfword of the accumulator contains a respective one quarter of the terms in the convolution of equation 33. The double word in the accumulator is stored in a memory location DW1.

The above steps are applied to obtain second, third and fourth resampled values, with the results being stored in memory at locations DW2, DW3, and DW4. In order to obtain the i-th resampled value (i=1, 2, 3, 4) according to equation 33, the sum of $DWi_1$, $DWi_2$, $DWi_3$ and $DWi_4$ must be formed, where $DWi_j$ denotes the jth halfword of DWi. One way of obtaining the required sums is as follows:

a) use FU3 to perform a permutation of the sixteen bytes contained in the concatenation of DW1 and DW2 to obtain the concatenation of DW5 and DW6 where DW5=<$DW1_1$, $DW2_1$, $DW1_2$, $DW2_2$> and DW6= <$DW1_3$, $DW2_3$, $DW1_4$, $DW2_4$>. FU3 contains a crossbar switch that can achieve an arbitrary permutation of the bytes in a sixteen-byte operand in one cycle.

b) use FU2 to add corresponding halfwords of DW5 and DW6, thereby obtaining DW7=<[$DW1_1$+$DW1_3$], [$DW2_1$+$DW2_3$], [$DW1_2$+$DW1_4$], [$DW2_2$+$DW2_4$]> (where [ ] encloses a halfword quantity).

c) use FU3 to perform a permutation of the sixteen bytes contained in the concatenation of DW3 and DW4 to obtain the concatenation of DW8 and DW9 where DW8=<$DW3_1$, $DW4_1$, $DW3_2$, $DW4_2$> and DW9= <$DW3_3$, $DW4_3$, $DW3_4$, $DW4_4$>.

d) use FU2 to add corresponding halfwords of DW8 and DW9, thereby obtaining DW10=<[$DW3_1$+$DW3_3$], [$DW4_1$+$DW4_3$], [$DW3_2$+$DW3_4$], [$DW4_2$+$DW4_4$]>.

e) use FU3 to perform a permutation of the sixteen bytes contained in the concatenation of DW7 and DW10 to obtain the concatenation of DW11 and DW12, where DW11=<[$DW1_1$+$DW1_3$], [$DW2_1$+$DW2_3$], [$DW3_1$+$DW3_3$], [$DW4_1$+$DW4_3$]>, and DW12=<[$DW1_2$+ $DW1_4$], [$DW2_2$+$DW2_4$], [$DW3_2$+$DW3_4$], [$DW4_2$+ $DW4_4$]>.

f) use FU2 to add corresponding halfwords of DW11 and DW12, thereby obtaining DW13=<[$DW1_1$+$DW1_2$+ $DW1_3$+$DW1_4$], [$DW2_1$+$DW2_2$+$DW2_3$+$DW2_4$], [$DW3_1$+$DW3_2$+$DW3_3$+$DW3_4$], [$DW4_1$+$DW4_2$+ $DW4_3$+$DW4_4$]>. Thus, $DW13_i$ holds the ith resampled value.

The above disclosed technique uses a segmented polynomial to compute values of an impulse response at the time of resampling. The segmented polynomial provides various advantages including the following:

1) The storage requirements are minimal (i.e. a few coefficients for each segmented polynomial), compared to the storage requirements of Smith's technique discussed above. For example, the technique disclosed herein would require 240 bytes to store polynomial coefficients if a segmented polynomial consisting of 24 fourth degree polynomial segments were used to approximate the desired impulse response function, where two bytes of storage are allocated to each polynomial coefficient. In contrast, if 16 bits of accuracy in the stored values of the impulse response function is desired, Smith's technique, discussed above, would require that the number of stored values of the impulse response per original sampling time be approximately $(2^{16})^{1/2}$=256. Assuming 24 original sampling time points, the total storage requirements would be 256×24×2 bytes/stored value=12228 bytes. Thus, the technique disclosed herein would result in a 50-fold reduction in storage requirements.

As processors become faster, it is becoming more cost-effective to compute filter responses in real time, than to incur the costs of memory latency, resulting from accessing large banks of polyphase filter coefficients, and the cost of memory devices to store them. Because of the large number of polyphase filter coefficients that are required, in Smith's approach, memory latency may be even further aggravated because of the higher likelihood of cache misses, which lead to additional delays. In contrast, the minimal storage required for the segmented polynomial coefficients results are more likely to result in higher cache hits, and hence lower latency resulting from efficient use of the cache memory.

2) The stored polynomial coefficients are independent of the resampling ratio and hence the technique of the present invention is applicable to applications in which the resampling ratio varies over time.

3) The segmented polynomials are fitted to the selected windowed sinc function in a least-mean-square sense. As a result, the frequency response associated with the technique is a good approximation of an ideal band-limited interpolator and avoids frequency distortions of the type associated with Zölzer's interpolation methods.

4) Zölzer's extra step of polyphase upsampling is avoided.

The resampling technique described above can be used, for example, to provide tones of various pitches from stored sounds. To synthesize a sound, an electronic instrument typically store samples of sounds (i.e. stored waveforms) of various pitches, timbres and velocities. In order to maintain reasonable memory requirements, it is often infeasible to store samples for sounds of all possible pitches that can be produced by the instrument.

In such instruments, a mechanism for varying the pitch of a sound associated with a stored waveform is required. One such mechanism involves varying the rate at which samples in a stored waveform are output from memory. This technique has the disadvantage of introducing additional complexity into the digital-to-analog conversion circuitry receiving and processing the stored waveform samples, and prevents digital mixing of several sound streams. An alternate solution that avoids the complexity associated with a variable sample output rate, is employed in instruments with a fixed rate of sample supply to the digital-to-analog tone producing circuitry. In one such instrument, discussed in U.S. Pat. No. 5,290,965, entitled "Asynchronous Waveform Generating Device For Use In An Electronical Musical Instrument", by Yoshida et al, issued Mar. 1, 1994, the samples supplied to the digital-to-analog tone producing circuitry can represent values of the originally sampled musical tone at times other than those associated with the original sample values in the stored waveform.

Figure 2:
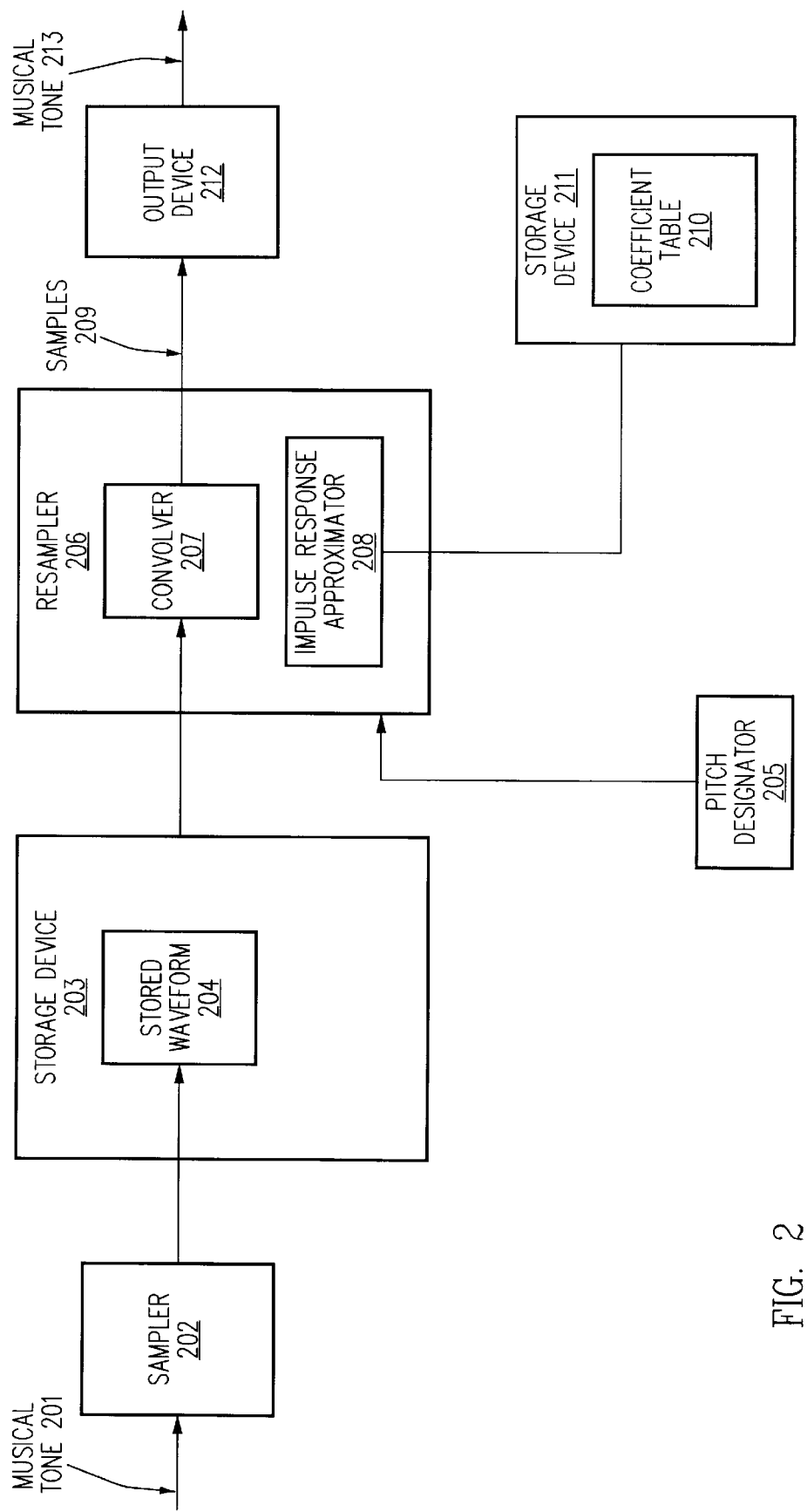
FIG. 2 shows an electronic musical instrument applying a resampling technique in accordance with the present invention.
Figure 3:
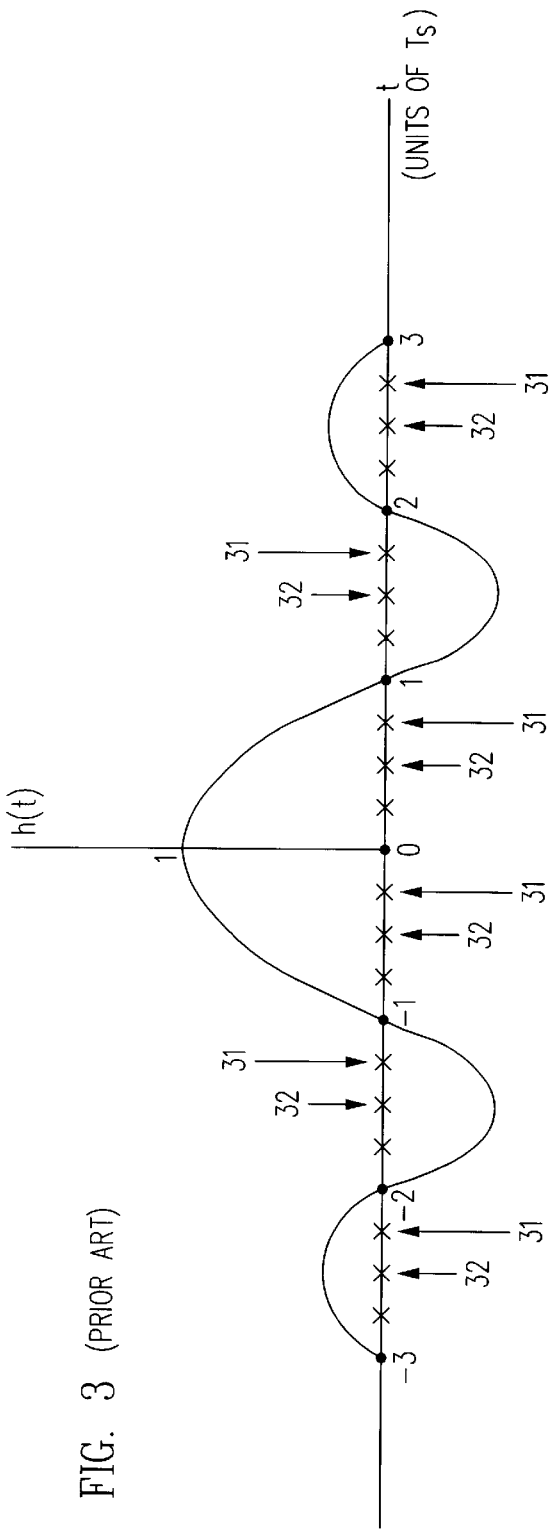
FIG. 3 (prior art) shows an impulse response function that is zero-valued outside a given time window.

FIG. 2 shows an electronic instrument implementing the sound synthesis technique of the present invention with a fixed sample output rate. As shown in FIG. 2, a musical tone 201 of pitch $P_1$, x(t), is sampled at the times $iT_s$, $0 \leq i \leq S$ thereby resulting in samples x[0], x[1], . . . , x[S] which are stored in a storage device 203 as a stored waveform 204. (In other embodiments, a sound other than a musical tone could be sampled and stored as stored waveform 204.)

The pitch of the tone output signal of output device 212 is controlled by the value of a pitch factor, which is provided to resampler 206 (which performs a convolution step 207 and an impulse response approximating step 208) at pitch selection step 205. In particular, if a pitch factor r is specified by the pitch designating step 205, then resampler 206 generates a set of samples 209, y[n], of the originally sampled musical tone x(t), corresponding to $t=nrT_s$, $0 \leq n \leq [S/r]$. One sample generated by resampler 206 is supplied to output device 212 every $T_c$ seconds, where $T_c$ is the output sampling rate. To prevent aliasing, the originally sampled musical tone is selected to be sufficiently band-limited to accommodate fully the anticipated range of upshifting of pitch. $T_c$ may or may not be equal to $T_s$.

Figure 7:
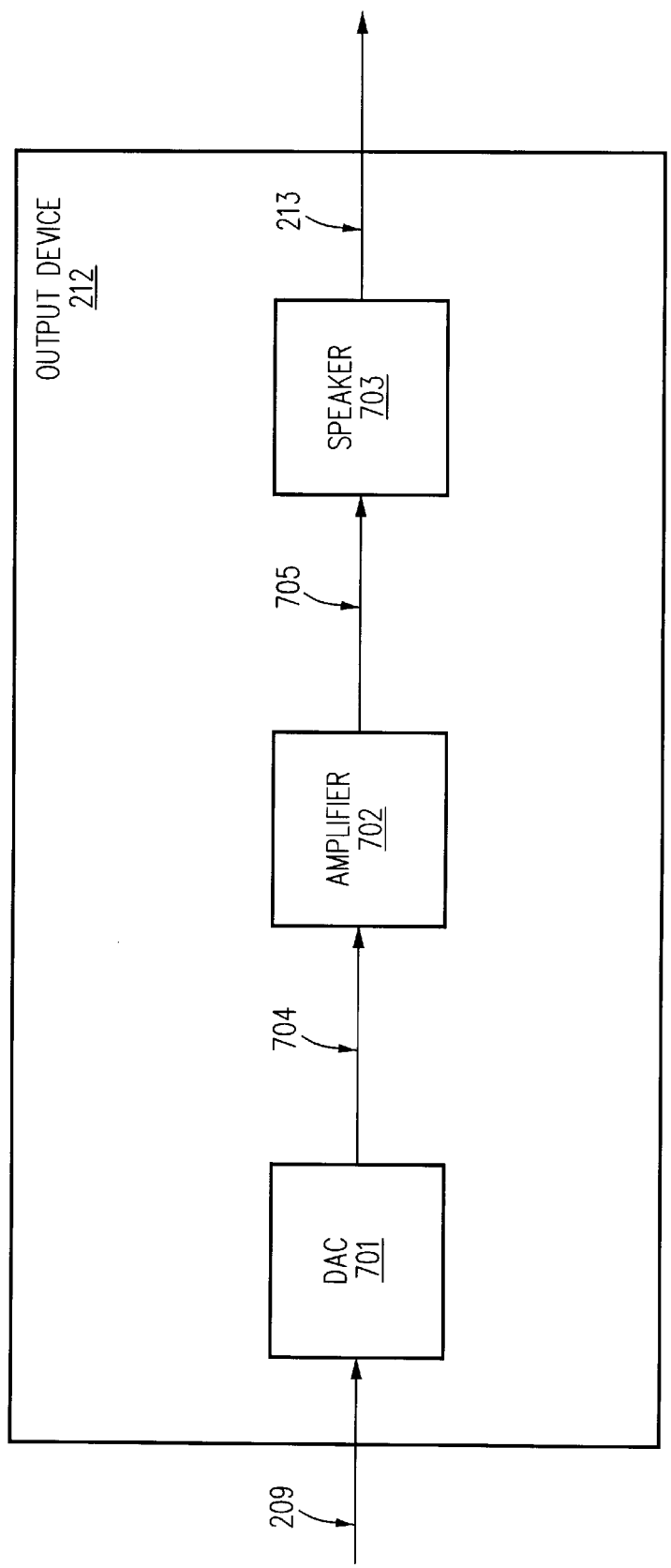
FIG. 7 shows in further detail the output device provided in the apparatus of FIG. 2.

FIG. 7 shows further detail of an output device 212, in accordance with one embodiment of the present invention. In this embodiment, output device 212 includes a digital-to-analog converter (DAC) 701, an amplifier 702 and a speaker 703. DAC 701 receives samples 209 and produces a corresponding continuous time signal 704. Amplifier 702 receives continuous time signal 704 from DAC 701 and produces an amplified continuous time signal 705. Speaker 703 receives amplified continuous time signal 705 from amplifier 702 and produces musical tone 213.

Given samples 209, output device 212 synthesizes a musical tone 213 of pitch $P_2=P_1*rT_s/T_c$. In order to prevent aliasing, as discussed above, the highest frequency of interest in the sampled musical tone 201 should be less than $0.5/rT_s$, where r is the maximum resampling factor that can be specified, and the frequencies above $0.5/rT_s$ should be filtered from the tone to create the stored waveform. In order to calculate a sample value, y[n], for the originally sampled musical tone 201, x(t), at a time $t=nrT_s$, techniques presented above, and in particular equation 33, can be applied, where the required values of impulse function h(t) are computed through use of a segmented polynomial as described above. A convolution step 207 convolves, according to equation 33 the samples in stored waveform 204 with approximated values of h(t) supplied by impulse response approximation step 208. Impulse response approximation step 208 generates approximated values of h(t) by evaluating a segmented polynomial whose coefficients as stored in a storage device 211 as a coefficient table 210. Resampler 206 could be implemented in either software or hardware.

The above detailed description is provided to illustrate specific embodiments of the present invention and is not intended to be limiting. Numerous modifications and variations within the scope of the present invention are possible. The present invention is defined by the following claims.

We claim:

1. A method of computing values of an analog signal at a first set of times, given values of the analog signal sampled at a second set of times, comprising the step of convolving the given sample values with values of an impulse response function of a filter, wherein the impulse response function is approximated by a segmented polynomial function and the values of the impulse response function are computed by evaluation of the segmented polynomial, wherein the segmented polynomial function consists of $N_S$ polynomials, $P_0$, $P_1$, . . . $P_{N_S-1}$, and the value of an impulse response function at a time t, t being less than a constant T, is approximated by $P_m(f)$, m and f being integer and fractional parts, respectively, of $tN_S/T$.

2. A method of computing values of an analog signal at a first set of times, given values of the analog signal sampled at a second set of times, comprising the step of convolving the given sample values with values of an impulse response function of a filter, wherein the impulse response function is approximated by a segmented polynomial function and the values of the impulse response function are computed by evaluation of the segmented polynomial, wherein the segmented polynomial function consists of $N_S$ polynomials, $P_0$, $P_1$, . . . $P_{N_S-1}$, and the value of the impulse response function at a time t, t being less than a constant T, is approximated by $P_m(f')$, m being an integer part of $tN_S/T$ and f' equaling 2f−1, f being a fractional part of $tN_S/T$.

3. The method of claim 1, wherein the time interval between consecutive elements of the first set of times is not constant.

4. The method of claim 2, wherein the time interval between consecutive elements of the first set of times is not constant.

5. A method of generating coefficients, c(0), C(1), . . . c(D), of a polynomial function, $$P(x) = \sum_{i=0}^{D} c(i)(x)^i,$$

having an argument x, the argument x having a range from −1 to 1 and the polynomial function being used to approximate the impulse response function of a filter, h(t), over a time range, each value in the time range of h(t) corresponding to a point in the argument range of the polynomial function, h(t) beings approximated by $$P(f') = \sum_{i=0}^{D} c(i)(f')^i$$

where f' is the point in the argument range corresponding to point t in the time range, comprising the steps of:
  selecting a set of points in the rang)re of the argument; and
  generating the coefficients, c(0), c(1), . . . c(D), of the polynomial function so as to fit, according to a criterion, the values of the polynomial function at the selected set of points in the range of the argument to the values of the impulse response function at the set of points in the time range corresponding to the selected set of points in the range of the argument.

6. The method of claim 5, further comprising the step of storing the coefficients in a storage device, wherein the stored coefficients are accessed by an apparatus that performs resampling.

7. A method of generating coefficients, c(0), C(1), . . . c(D), of a polynomial function, $$P(x) = \sum_{i=0}^{D} c(i)(x)^i,$$

having an argument x, the argument x having a range and the polynomial function being used to approximate the impulse response function of a filter, h(t), over a time range, each value in the time range of h(t) corresponding to a point in the argument range of the polynomial function, h(t) being approximated by $$P(f') = \sum_{i=0}^{D} c(i)(f')^i$$

where f' is the point in the argument range corresponding to point t in the time range, comprising the steps of:

selecting a set of points in the range of the argument; and generating the coefficients, c(0), c(1), . . . c(D), of the polynomial function so as to fit, according to a criterion, the values of the polynomial function at the selected set of points in the range of the argument to the values of the impulse response function at the set of points in the time range corresponding to the selected set of points in the range of the argument;

wherein the criterion is least mean-squared error, the selected points in the range of the argument are $f'_1$, $f'_2$, . . . $f'_N$, the points in the time range corresponding to $f'_1$, $f'_2$, . . . $f'_N$ are $t_1$, $t_2$, . . . $t_N$, respectively, and the step of generating the coefficients comprises the steps of:

forming an N×(D+1) matrix M, the element of M in the jth row and ith column, M, being equal to $(f'_1)^i$, $1 \leq i \leq N$, $0 \leq j \leq D$;

forming an N×1 matrix V, the element of V in the ith row, V, being equal to $h(t_i)$, $1 \leq i \leq N$; forming $M^\dagger$, the pseudo-inverse of matrix M; and forming the product $M^\dagger V$, thereby producing a (D+1)×1 matrix C, where C=c(i), $0 \leq i \leq D$.

8. The method of claim 7, further comprising the step of storing the coefficients in a storage device, wherein the stored coefficients are accessed by an apparatus that performs resampling.

9. A method of generating coefficients, c(0), C(1), . . . c(D), of a polynomial function, $$P(x) = \sum_{i=0}^{D} c(i)(x)^i,$$

having an argument x, the argument x having a range and the polynomial function being used to approximate the impulse response function of a filter, h(t), over a time range, each value in the time range of h(t) corresponding to a point in the argument range of the polynomial function, h(t) being approximated by $$P(f') = \sum_{i=0}^{D} c(i)(f')^i$$

where f' is the point in the argument range corresponding to point t in the time range, comprising the steps of:

selecting a set of points in the range of the argument; and generating the coefficients, c(0), c(1), . . . c(D), of the polynomial function so as to fit, according to a criterion, the values of the polynomial function at the selected set of points in the range of the argument to the values of the impulse response function at the set of points in the time range corresponding to the selected set of points in the range of the argument;

wherein the criterion is least mean-squared error, the selected points in the range of the argument are $f'_1$, $f'_2$, . . . $f'_N$, the points in the time range corresponding to $f'_1$, $f'_2$ $f'_N$ are $t_1$, $t_2$, . . . $t_N$, respectively, and the step of generating the coefficients comprises the step of:

solving the system of equations given by $M^T M C = M^T V$ for C, where M is an N×(D+1) matrix, the element of M in the ith row and jth column, M, being equal to $(f'_i)^j$, $1 \leq i \leq N$, $0 \leq j \leq D$, $M^T$ is the transpose of M, C is a (D+1)×1 matrix, the element of C in the ith row, C, equalling c(i), $0 \leq i \leq D$, and V is an N×1 matrix, the element of V in the ith row, V, equalling $h(t_i)$, $1 \leq i \leq N$.

10. The method of claim 9, further comprising the step of storing the coefficients in a storage device, wherein the stored coefficients are accessed by an apparatus that performs resampling.

* * * * *